United States Patent
Aida et al.

(10) Patent No.: US 12,230,471 B2
(45) Date of Patent: Feb. 18, 2025

(54) ION MILLING DEVICE

(71) Applicant: Hitachi High-Tech Corporation, Tokyo (JP)

(72) Inventors: Shota Aida, Tokyo (JP); Hisayuki Takasu, Tokyo (JP); Atsushi Kamino, Tokyo (JP); Hitoshi Kamoshida, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 290 days.

(21) Appl. No.: 17/788,556

(22) PCT Filed: Dec. 24, 2019

(86) PCT No.: PCT/JP2019/050524
§ 371 (c)(1),
(2) Date: Jun. 23, 2022

(87) PCT Pub. No.: WO2021/130842
PCT Pub. Date: Jul. 1, 2021

(65) Prior Publication Data
US 2023/0048299 A1    Feb. 16, 2023

(51) Int. Cl.
| | |
|---|---|
| *H01J 37/24* | (2006.01) |
| *H01J 37/08* | (2006.01) |
| *H01J 37/244* | (2006.01) |
| *H01J 37/30* | (2006.01) |
| *H01J 37/305* | (2006.01) |

(52) U.S. Cl.
CPC ............ *H01J 37/244* (2013.01); *H01J 37/08* (2013.01); *H01J 37/305* (2013.01); *H01J 2237/024* (2013.01); *H01J 2237/24564* (2013.01)

(58) Field of Classification Search
CPC ........ H01J 37/244; H01J 37/08; H01J 37/305; H01J 2237/024; H01J 2237/24564
See application file for complete search history.

(56) References Cited

U.S. PATENT DOCUMENTS

2006/0097195 A1    5/2006   Angel et al.
2006/0231751 A1* 10/2006   Zuleta ................. H01J 49/0018
                                                    250/287

(Continued)

FOREIGN PATENT DOCUMENTS

JP            8-5528 A     1/1996
JP      2002-216653 A     8/2002

(Continued)

OTHER PUBLICATIONS

International Search Report (PCT/ISA/210) issued in PCT Application No. PCT/JP2019/050524 dated Mar. 3, 2020 with English translation (four (4) pages).

(Continued)

*Primary Examiner* — Nicole M Ippolito
(74) *Attorney, Agent, or Firm* — Crowell & Moring LLP (57) ABSTRACT

There is provided an ion milling apparatus that can enhance reproducibility of ion distribution.

The ion milling apparatus includes an ion source 101, a sample stage 102 on which a sample processed by radiating a non-convergent ion beam from the ion source 101 is placed, a drive unit 107 that moves a measurement member holding section 106 holding an ion beam current measurement member 105 along a track located between the ion source and the sample stage, and an electrode 112 that is disposed near the track, in which a predetermined positive voltage is applied to the electrode 112, the ion beam current measurement member 105 is moved within a radiation range of the ion beam by the drive unit 107, in a state in which the ion beam is output from the ion source 101 under a first radiation condition, and an ion beam current that flows when the ion beam is radiated to the ion beam current measurement member 105 is measured.

10 Claims, 7 Drawing Sheets

(56) References Cited

U.S. PATENT DOCUMENTS

| | | | |
|---|---|---|---|
| 2008/0179515 A1* | 7/2008 | Sperline | H01J 49/00 |
| | | | 250/290 |
| 2012/0103945 A1 | 5/2012 | Straw et al. | |
| 2015/0371857 A1* | 12/2015 | Wan | H01J 37/3171 |
| | | | 438/514 |
| 2017/0221671 A1 | 8/2017 | Asai et al. | |
| 2017/0221677 A1 | 8/2017 | Asai et al. | |

FOREIGN PATENT DOCUMENTS

| | | |
|---|---|---|
| JP | 2011-527639 A | 11/2011 |
| JP | 2016-31869 A | 3/2016 |
| TW | 201511062 A | 3/2015 |
| TW | 202125559 A | 7/2021 |
| WO | WO 2016/017661 A1 | 2/2016 |

OTHER PUBLICATIONS

Japanese-language Written Opinion (PCT/ISA/237) issued in PCT Application No. PCT/JP2019/050524 dated Mar. 3, 2020 (three (3) pages).

Taiwanese-language Office Action issued in Taiwanese Application No. 109145411 dated Aug. 31, 2021 (three (3) pages).

Korean-language Office Action issued in Korean Application No. 10-2022-7019904 dated Aug. 7, 2024 with English translation (12 pages).

* cited by examiner

[FIG. 3]
(CROSS-SECTIONAL VIEW)

(TOP VIEW)

ION MILLING DEVICE

TECHNICAL FIELD

The present invention relates to an ion milling apparatus.

BACKGROUND ART

JP-A-2002-216653 (PTL 1) discloses an ion milling apparatus which generates plasma in an ion source to extract ions, radiates the extracted ions, and applies processing to a substrate or the like. For example, the ion milling apparatus performs processing on a 4-inch (φ100) substrate and controls the distribution of the extracted ion beam by electrically controlling the plasma distribution in the ion source to obtain a large-caliber ion beam with a uniform or desired distribution. As an example of a control method, a distribution state of the ion beam is measured by using a Faraday cup, and a voltage applied to a plasma control electrode is adjusted based on the measurement result.

CITATION LIST

Patent Literature

PTL 1: JP-A-2002-216653

SUMMARY OF INVENTION

Technical Problem

An ion milling apparatus is a device for polishing a surface or cross section of a sample by irradiating the sample (for example, metal, semiconductor, glass, ceramic, and the like) with a non-convergent ion beam and flicking off atoms on the surface of the sample by a sputtering phenomenon. Some ion milling apparatuses are used as a pretreatment apparatus for observing the surface or cross section of the sample by a scanning electron microscope (SEM) or a transmission electron microscope (TEM). In many cases, an effective penning system is adopted for miniaturizing a structure for the ion source for such a pretreatment apparatus.

Since an ion beam from a penning type ion source is radiated to the sample without being converged, the ion distribution in a vicinity of an ion beam radiation point on the sample has characteristics that an ion density is the highest at a center and decreases outward from the center. On the other hand, especially in surface observation with an electron microscope, the surface of the sample needs to be polished smoothly to accurately observe a structure and composition. Therefore, the ion beam is radiated at a low incidence angle while rotating the sample. Consequently, a wide and smooth processing surface can be obtained in a peripheral range including a part to be observed. Since the ion density is directly related to a processing speed (milling rate) of the sample, the characteristics of the ion distribution greatly affect a processing shape of a sample processing surface.

An ion source with a penning system is known to wear an internal constituent member by the ion generated and injected from a structure thereof. As a result of processing the sample, fine particles generated and floating from the processing surface adhere to the ion source, especially an ion beam radiation port, to cause dirt. Due to these factors or the like, the characteristics of the ion beam change when the ion milling apparatus is continued to be used, and reproducibility of the processing shape of the sample processing surface is reduced. If the observation by the electron microscope is performed for mass production process management purposes, the same processing is required for many samples, and thus a decrease in the reproducibility of the processing shape of the ion milling apparatus may lead to a decrease in defect detection accuracy.

In view of such a problem, the present invention provides an ion milling apparatus that can adjust radiation conditions of an ion beam suitable for the ion milling apparatus for performing pretreatment processing of observing a surface or cross section of a sample.

Solution to Problem

An ion milling apparatus according to an embodiment includes an ion source, a sample stage on which a sample processed by radiating a non-convergent ion beam from the ion source is placed, a measurement member holding section that holds a linear ion beam current measurement member extending in a first direction, a drive unit that moves the measurement member holding section holding the ion beam current measurement member along a track extending in a second direction orthogonal to the first direction and located between the ion source and the sample stage, an electrode that is disposed near the track, and a controller, in which the controller applies a predetermined positive voltage to the electrode, moves the ion beam current measurement member within a radiation range of the ion beam by the driving unit in a state in which the ion beam is output from the ion source under a first radiation condition, and measures an ion beam current flowing through the ion beam current measurement member when the ion beam is radiated to the ion beam current measurement member.

Advantageous Effects of Invention

Reproducibility of ion distribution of an ion milling apparatus can be enhanced.

Other problems and new features will be evident from the description and attached drawings in this specification.

DESCRIPTION OF EMBODIMENTS

An example of the present invention is described based on drawings.

Figure 1:
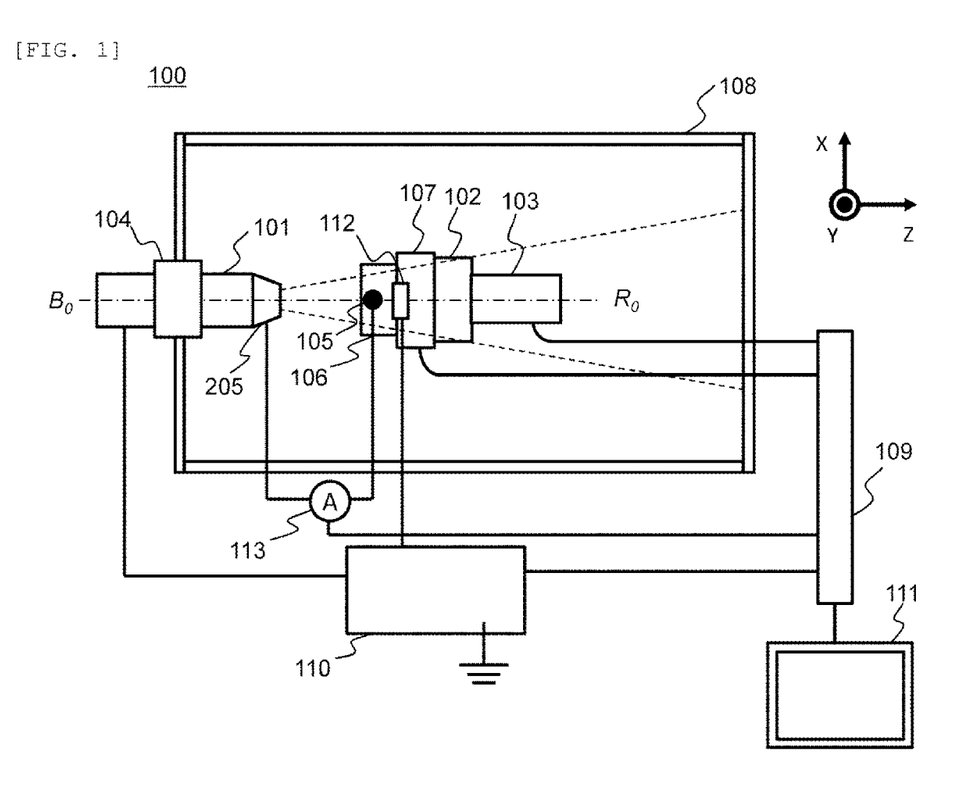
FIG. 1 is an example of a configuration of an ion milling apparatus (schematic diagram).

FIG. 1 is a diagram (schematic diagram) showing a main part of an ion milling apparatus 100 which is an embodiment of the present invention from above (vertical direction is defined as a Y direction). A sample chamber 108 that can be kept in a vacuum state is provided with an ion source 101 attached via an ion source position adjustment mechanism 104, a sample stage 102 for installing a sample to be processed, and a sample stage rotation drive source 103 for rotating the sample stage 102 around a rotation center $R_0$. Since the ion beam from the ion source 101 is radiated to the sample without being converged, ion beam distribution in a vicinity of an ion beam radiation point on the sample has characteristics that an ion density is the highest at a center and decreases outward from the center. Since the ion density is directly related to a processing speed of the sample, the ion beam distribution near the ion beam radiation point greatly affects the processing shape of the sample. Therefore, in order to measure the ion beam distribution of a non-convergent ion beam from the ion source 101, the ion milling apparatus 100 includes an ion beam current measurement member 105 disposed close to a sample placement surface of the sample stage 102, a measurement member holding section 106 for holding the ion beam current measurement member 105, a drive unit 107 for driving the measurement member holding section 106 back and forth in an X direction, and an electronic trap 112. Each mechanism configuring the ion milling apparatus 100 is supplied with power from a power supply unit 110 and controlled by a controller 109. Also, control parameters and operating states of the apparatus are displayed on a display section 111.

Since the ion beam from the ion source 101 is emitted in a state of being radially spread around an ion beam center $B_0$, it is necessary to adjust the rotation center $R_0$ of the sample stage 102 to coincide with the ion beam center $B_0$. In order to facilitate this adjustment, the ion source 101 is attached to the sample chamber 108 via the ion source position adjustment mechanism 104 for adjusting a position thereof in X, Y and Z directions. Consequently, a position of the ion beam center $B_0$ of the ion source 101 and, more specifically, a position on an XY plane (plane including the X and Y directions) and a working distance (WD, a position in the Z direction) can be adjusted.

As detailed later, the ion beam current measurement member 105 is a conductive member, and an amount of ions colliding with the ion beam current measurement member 105 from the ion source 101 is measured by an ammeter 113 as an ion beam current between the ion source 101 and the ion beam current measurement member 105. The controller 109 acquires the ion beam current for each position along the X direction by measuring the ion beam current by the ammeter 113 while moving the ion beam current measurement member 105 in the X direction, and displays the ion beam current as an ion beam profile on the display section 111. During the measurement of the ion beam profile, the electronic trap 112 is disposed closer to the sample stage 102 side from the ion beam current measurement member 105 at a position where the ion beam current measurement member 105 and the electronic trap 112 overlap when viewed from the ion source 101 when the ion beam center $B_0$ and the ion beam current measurement member 105 cross each other. A predetermined positive potential is applied to the electronic trap 112 from a power supply unit 110.

Figure 2:
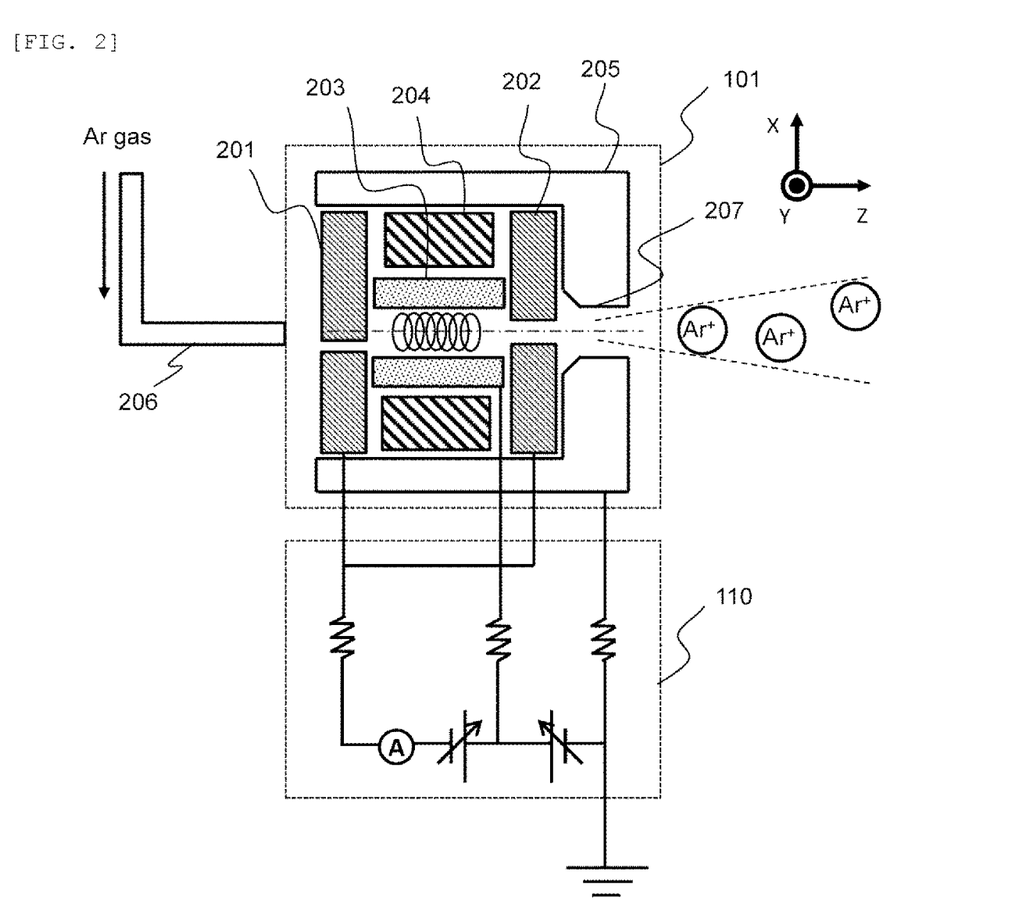
FIG. 2 is a diagram showing a configuration of an ion source and a power supply circuit.

FIG. 2 is a schematic diagram showing an internal structure of the ion source 101 and a power supply circuit of the power supply unit 110 that applies a voltage of the ion source 101. The power supply circuit shows only a circuit related to the ion source 101. FIG. 2 shows an ion source (penning type ion source) with a penning system adopted, as the ion source 101. An anode 203 to which a discharge voltage is applied from the power supply unit 110 is disposed between a first cathode 201 and a second cathode 202 having the same potential inside the penning type ion source, and electrons are generated by a potential difference between the anode and the cathodes. The generated electrons stay inside the ion source by a permanent magnet 204. On the other hand, argon gas is introduced into the ion source from the outside through a piping 206, and argon ions are generated by electrons colliding with the argon gas. The argon ions are attracted to an acceleration electrode 205 to which an acceleration voltage is applied and radiated as an ion beam through an ion beam radiation port 207.

While the beam radiation is repeated, in the ion source 101, internal components of the ion source 101 are worn out or fine particles generated from the workpiece to be radiated are scattered and adhere to the ion beam radiation port 207, whereby the distribution of the ion beam radiated by the ion source 101 fluctuates. By performing maintenance such as replacement and cleaning of the internal components of the ion source 101, wearing of the internal components and adhesion of fine particles to the ion beam radiation port 207 are eliminated, but it is not guaranteed to return to the ion beam distribution before the fluctuation. Therefore, for example, the ion beam distribution is confirmed after maintenance, and the working distance, the discharge voltage and a gas flow rate of the ion source 101 are adjusted so as to obtain a desired ion beam distribution. Consequently, reproducibility of processing by the ion milling apparatus can be enhanced.

Figure 3:
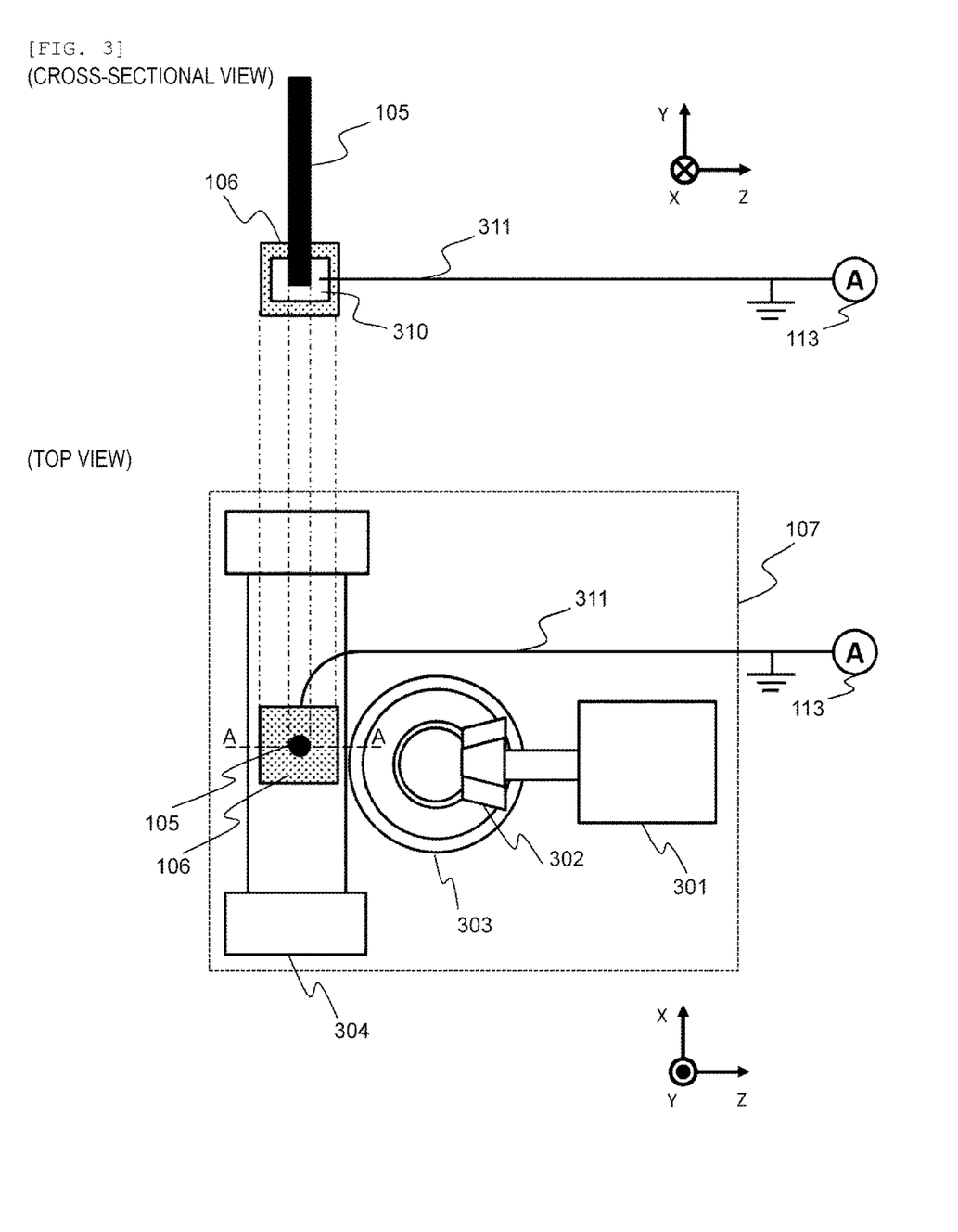
FIG. 3 is an example of a configuration of a drive unit.

An example of a configuration of the drive unit 107 for driving the ion beam current measurement member 105 is shown in FIG. 3. In the drawing, the top view of the drive unit 107 and the cross-sectional view of the ion beam current measurement member 105 and the measurement member holding section 106 along the A-A line in the top view are shown.

The measurement member holding section 106 is made of an insulating material, and is provided with an ion beam current extraction section 310 having conductivity inside thereof. The ion beam current measurement member 105 is attached to the ion beam current extraction section 310 and connected to an ion beam current extraction wiring 311 via the ion beam current extraction section 310. The ion beam current extraction wiring 311 is connected to the ammeter 113.

The drive unit 107 includes a motor 301, a bevel gear 302, a gear 303 and a rail member 304. When the bevel gear 302 and the gear 303 provided on the drive shaft of the motor 301 rotate and transmit the drive to the rail member 304, the measurement member holding section 106 moves back and forth in the X direction. A track on which the measurement member holding section 106 moves back and forth is located between the ion source 101 and the sample stage 102. As far as possible, it is preferable to position near the sample stage 102. The motor 301 does not need to be provided exclusively for the drive unit 107, and can also be used as a sample stage rotation drive source 103 for rotating the sample stage 102.

The ion beam current measurement member 105 becomes a state of being processed by being irradiated with the ion beam from the ion source 101 during the measurement of the ion beam current. As the member is thus consumed with each measurement, a member having a low sputtering yield which is difficult to be processed by ions is suitable. In addition, a linear material is used as the ion beam current measurement member 105, and the ion beam current measurement member 105 moves in a non-convergent ion beam radiation range to measure the ion beam profile. This means that a diameter of the ion beam current measurement member 105 determines the spatial resolution of a measurable ion distribution. Therefore, the diameter of the ion beam current measurement member 105 is preferably smaller than the half-value width of the ion beam at the time of processing. For example, a graphite carbon linear material having a diameter of 0.2 mm or more and 0.5 mm or less can be used. Further, in order to suppress irregular behavior of ions caused by the ions colliding with the ion beam current measurement member 105, the cross-section shape of the ion beam current measurement member 105 is preferably circular. Besides the graphite carbon linear material, a tungsten linear material or the like can be used. The ion beam current measurement member 105 is removable from the measurement member holding section 106 and is replaced with a new ion beam current measurement member when the ion beam current measurement member 105 is exhausted by the ion beam.

Figure 4:
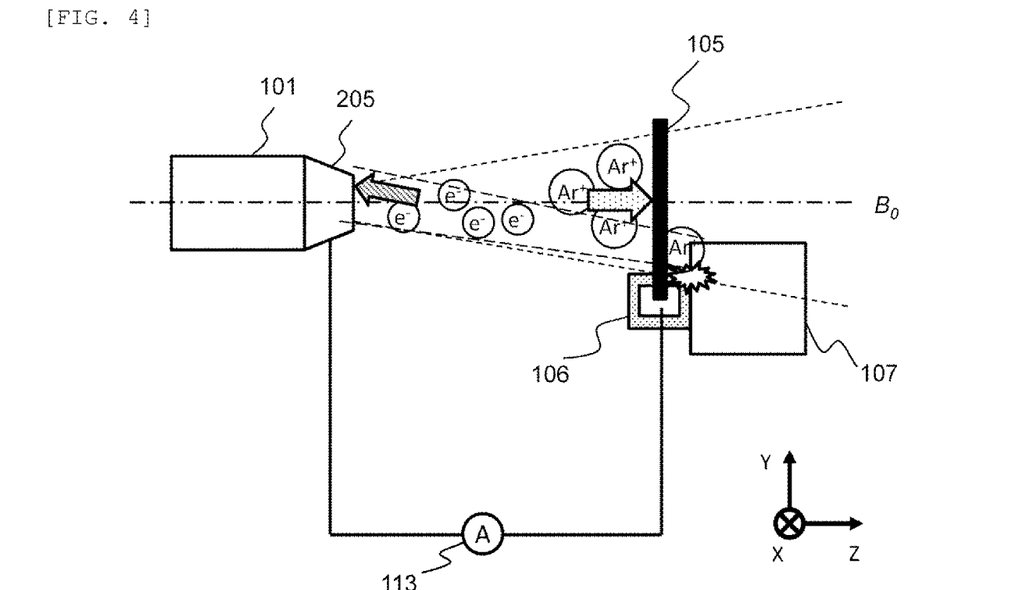
FIG. 4 is a diagram showing a state of measurement of an ion beam current in a comparative example.

FIG. 4 is a schematic diagram showing a state of measuring an ion beam current when the electronic trap 112 is not provided. In a measurement method, a current flowing by the argon ions, having a positive charge radiated from the ion source 101, colliding with the ion beam current measurement member 105 is measured by the ammeter 113. However, in a configuration of this comparative example, it is confirmed that a current value is measured from the ammeter 113 even though the ion beam current measurement member 105 is moved to a position where the ion beam is not radiated. This is because the current value measured by the ammeter 113 is increased when a secondary electron or backscattered electron is generated by the argon ions colliding with a structure near the ion beam current measurement member 105, specifically the measurement member holding section 106, and by the generated secondary electron or backscattered electron colliding with the acceleration electrode 205 of the ion source 101.

Figure 5:
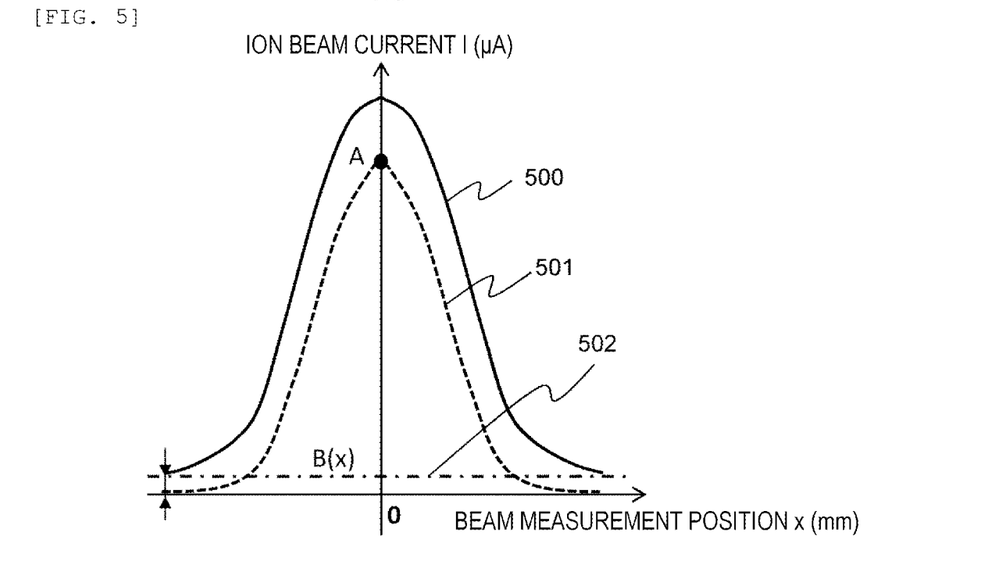
FIG. 5 is a diagram showing an ion beam profile measured by the comparative example.

FIG. 5 shows an ion beam profile measured by the comparative example shown in FIG. 4. The horizontal axis is a beam measurement position, and a vertical axis represents an ion beam current I measured by the ammeter 113. The beam measurement position is expressed with an intersection point between the track of the ion beam current measurement member 105 and the ion beam center $B_0$ on the XZ plane as an origin. As described above, a measured ion beam profile 500 is the sum of a true ion beam profile 501 flowing by the argon ions colliding with the ion beam current measurement member 105 and a background noise profile 502 due to the electrons generated by the radiation of the ion beam. Although the background noise profile 502 is simplified as a constant value in FIG. 5, the background noise profile 502 actually takes a value that fluctuates according to the measurement position due to variation in generation of secondary electrons and backscattered electrons and differences in an amount of collision of electrons with the ion beam current measurement member 105 due to the beam measurement position.

The true ion beam profile 501 is thought to conform to Gaussian distribution. Accordingly, the measured ion beam current I(x) can be expressed by (Equation 1).

$$I(x) = \frac{A}{\sigma}e^{(-x^2/2\sigma^2)} + B(x) \qquad \text{[Equation 1]}$$

Here, A is a maximum value of the true ion beam profile and $\sigma$ is a variance of the true ion beam profile. In other words, in order to obtain information on the true ion beam profile 501, the influence of the background noise profile 502 needs to be removed from the ion beam profile 500 to be measured.

Figure 6A:
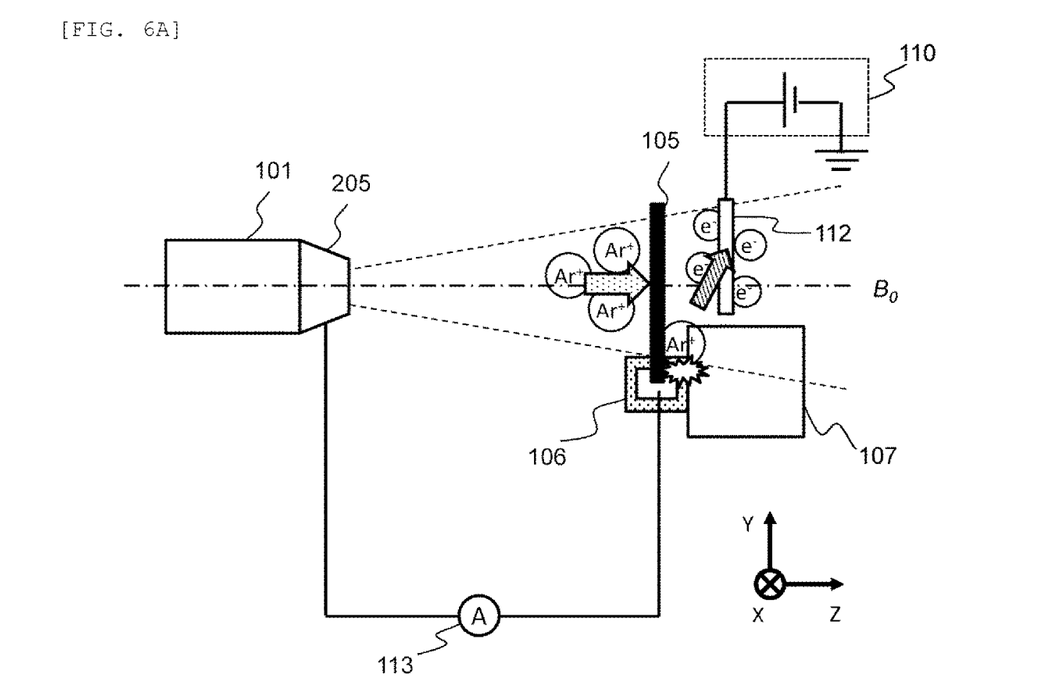
FIG. 6A is a diagram showing a state of measurement of an ion beam current in an example.
Figure 6B:
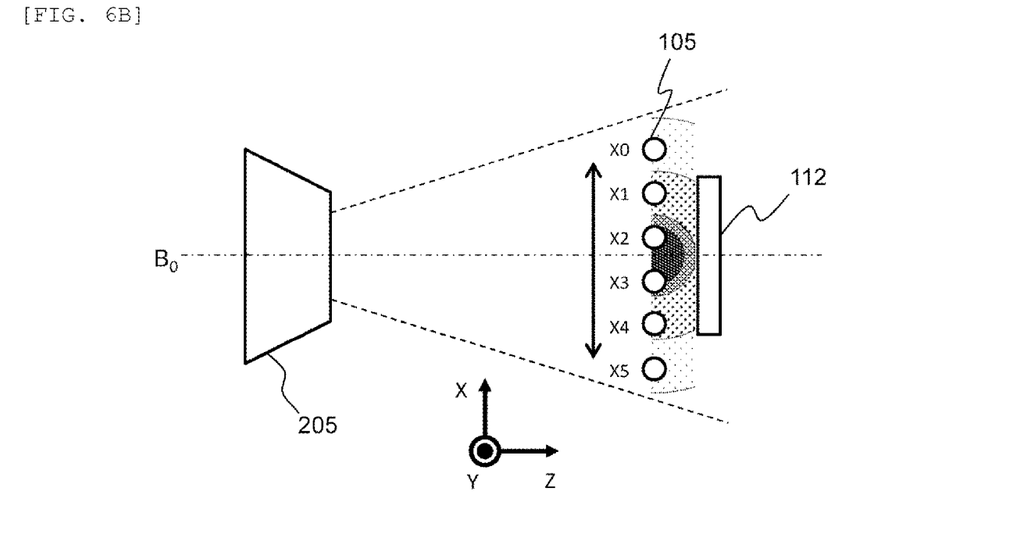
FIG. 6B is a diagram showing a positional relationship between a track of an ion beam current measurement member and an electronic trap in the example.

FIG. 6A shows a state of measuring an ion beam current when the plate-like electronic trap 112 is provided. Also, a positional relationship between the track of the ion beam current measurement member 105 (coordinates X0 to X5 indicate positions on the track) and the electronic trap 112 is shown in FIG. 6B. In addition, the strength of the ion beam near the track of the ion beam current measurement member 105 is schematically shown in a light and dark manner. An ion beam strength is set with the ion beam center B1 as a maximum strength, and reduced in accordance with Gaussian distribution toward the periphery. A region of higher ion beam strength is displayed as a region having a higher density and a region of lower beam strength is displayed as a region having a lower density.

Since secondary electrons and backscattered electrons generated by collision of argon ions have negative charges, the electronic trap 112 applied with a positive voltage is provided near the track of the ion beam current measurement member 105 to capture the generated secondary electrons and backscattered electrons. A voltage applied to the electronic trap 112 is supplied from the power supply unit 110, and a voltage value is set by the controller 109 (not shown). A positive voltage applied to the electronic trap 112 is set as a positive voltage so as not to affect the measurement of the ion beam profile.

The electronic trap 112 is disposed closer to the sample stage 102 side from the track of the ion beam current measurement member 105 so that the ion beam current measurement member 105 and the electronic trap 112 overlap when viewed from the ion source 101 when the ion beam center $B_0$ and the ion beam current measurement member 105 cross each other. As shown in FIG. 6B, the ion beam strength of the ion source 101 is the highest in a vicinity of the ion beam center $B_0$, and a generation amount and energy of secondary electrons and backscattered electrons are large. Accordingly, generated secondary electrons and backscattered electrons can be efficiently captured by providing the electronic trap 112 near the ion beam center $B_0$.

However, when the electronic trap 112 is disposed as shown in FIG. 6A, the electronic trap 112 itself may be a source of secondary electrons or backscattered electrons due to the collision of argon ions. Especially, since backscattered electrons have high energy and high rectilinearity, an amount of electrons reaching the acceleration electrode 205 is also large. Here, since a generation amount of backscattered electrons is known to increase with the increase of the atomic number of the component element to be radiated, a light element and a material with a low sputtering yield are preferably used for the electronic trap 112. Specifically, graphite carbon is preferably used.

By removing the influence of secondary electrons and backscattered electrons generated from structures such as the measurement member holding section 106 by the electronic trap 112, information on the true ion beam profile 501 as shown in the dashed line in FIG. 5 can be obtained. In order to efficiently capture secondary electrons and backscattered electrons, the electronic trap 112 needs to have a certain area, but the size is not limited. For example, the electronic trap 112 may be a circular plate electrode having the center $B_0$ of the ion beam as a center and having a diameter of the full width half maximum of the ion beam or a square-shaped plate electrode having one side of the full width half maximum of the ion beam. Furthermore, as long as electrons can be trapped, mesh electrodes and other electrodes are allowed, not limited to plate electrodes.

Figure 7A:
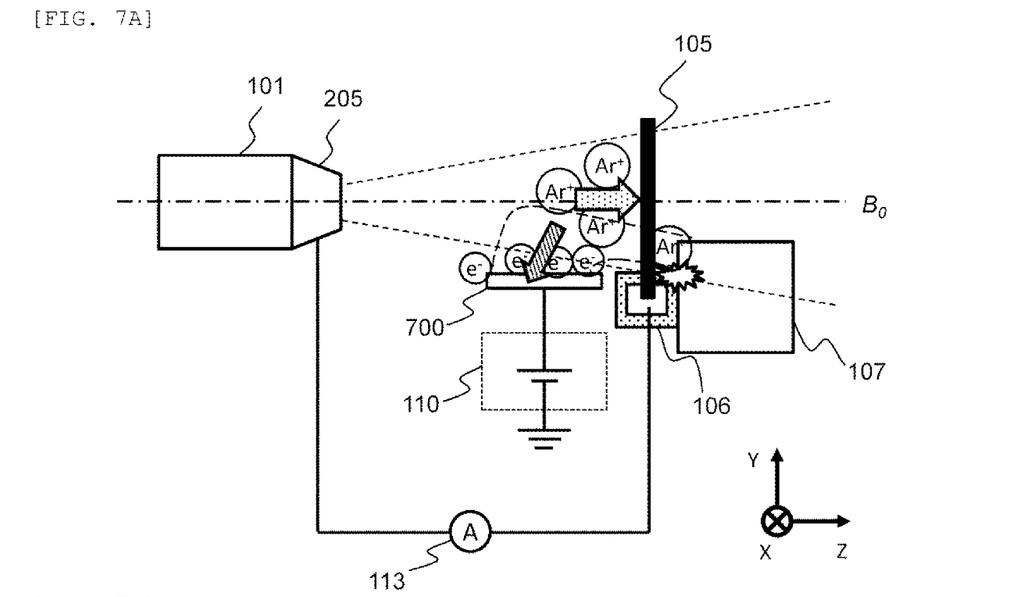
FIG. 7A is a diagram showing a state of measurement of an ion beam current in a modification example.
Figure 7B:
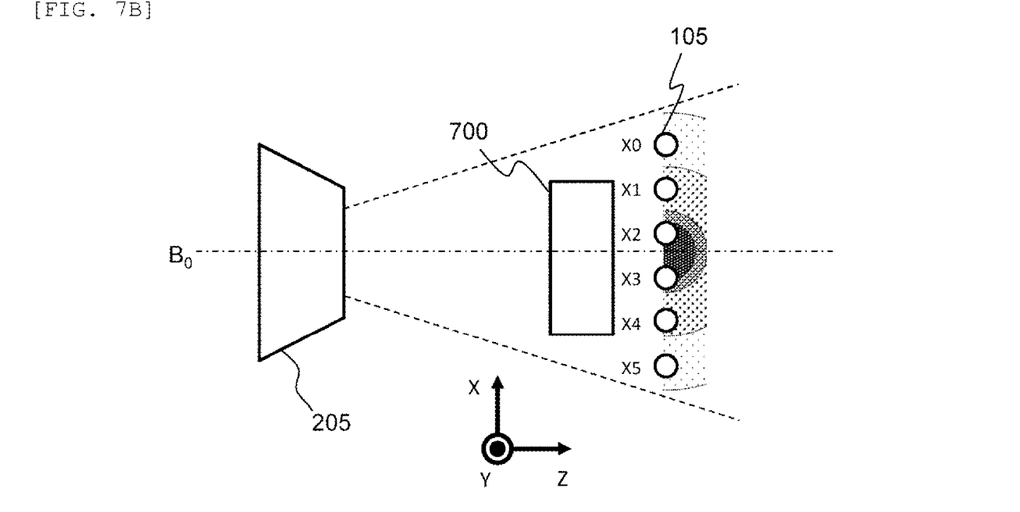
FIG. 7B is a diagram showing a positional relationship between a track of an ion beam current measurement member and an electronic trap in the modification example.

FIGS. 7A and 7B show a modification example of an electronic trap. In FIG. 6A, the electronic trap is disposed behind the ion beam current measurement member 105 when viewed from the ion source 101, while in FIG. 7A, the electronic trap is disposed closer to the ion source 101 from the ion beam current measurement member 105. FIG. 7A shows a side view, and FIG. 7B shows a top view. A voltage applied to an electronic trap 700 is also supplied from the power supply unit 110, and a voltage value is set by the controller 109 (not shown). The electronic trap 700 is disposed in a region where an ion beam from the ion source 101 is not radiated, and captures the generated secondary electrons and backscattered electrons before reaching the acceleration electrode 205. Unlike the electronic trap 112 shown in FIGS. 6A and 6B, since ion beams are not radiated, a highly conductive material such as copper or phosphorus bronze can be used as the electronic trap 700. Both the electronic trap 112 and the electronic trap 700 may be provided.

Figure 8:
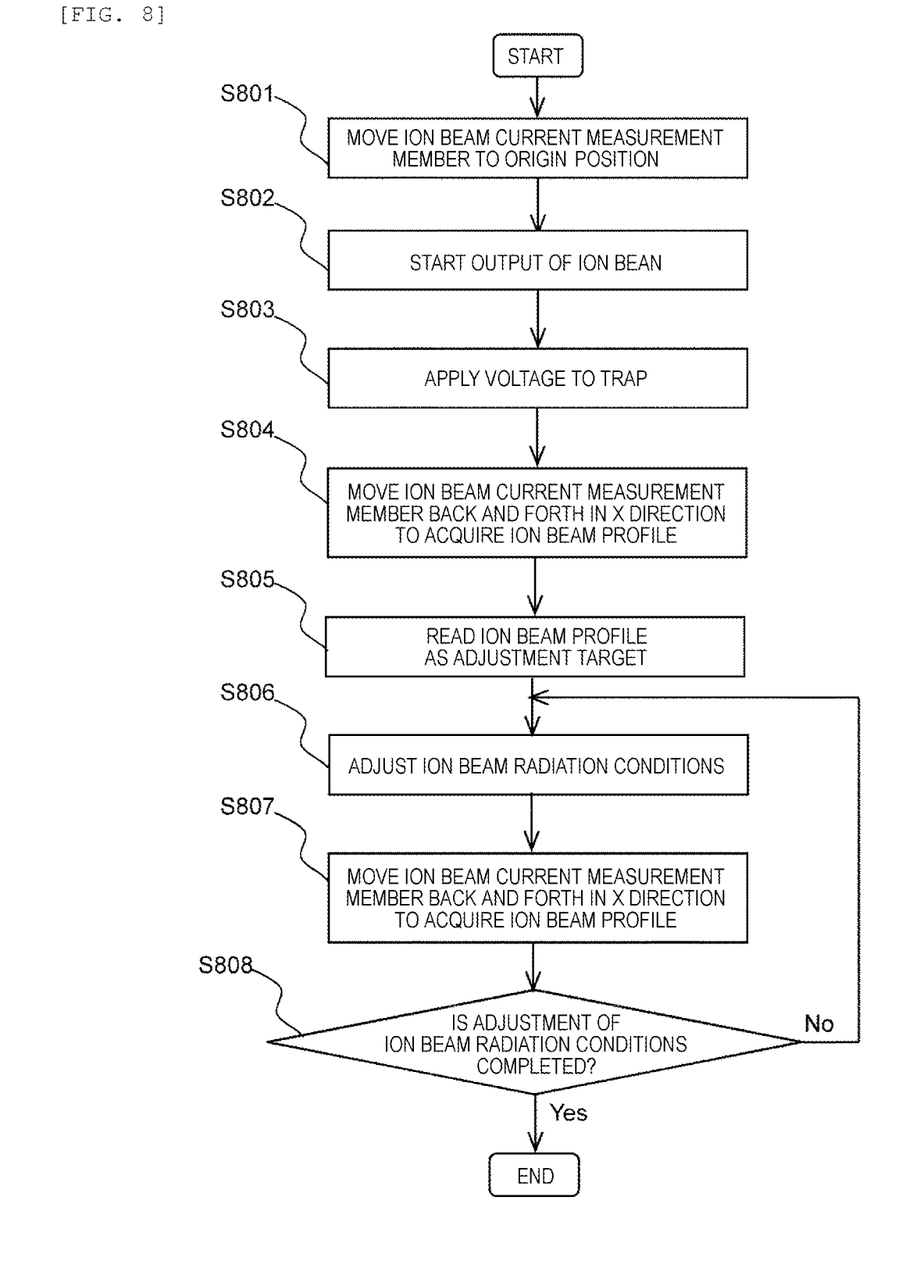
FIG. 8 is a flowchart for adjusting ion beam radiation conditions.

In the ion milling apparatus shown in FIG. 1, an acquisition of an ion beam profile executed by the controller 109 and an adjustment method of ion beam radiation conditions are described by using the flowchart in FIG. 8.

S801: The controller 109 controls the drive unit 107 to move the ion beam current measurement member 105 to an origin position. Here, the origin position is set to be the center of the ion beam radiation range, but the setting of the origin position is not limited thereto.

S802: The controller 109 controls the power supply unit 110 and outputs an ion beam from the ion source 101 according to ion beam radiation conditions held as a current setting. The current setting refers to the ion beam radiation conditions determined as the processing conditions of the sample. In general, an acceleration voltage, a discharge voltage and a gas flow rate of the ion source 101 when the sample is processed are determined.

S803: The controller 109 controls the power supply unit 110 to apply a predetermined voltage to the electronic trap 112 (and/or the electronic trap 700). A positive voltage applied to the electronic trap is determined to be a voltage within a range that does not adversely affect the measurement of the ion beam profile.

S804: After starting the output of the ion beam, the controller 109 controls the drive unit 107 to measure the ion beam current by the ammeter 113 while moving the ion beam current measurement member 105 back and forth in the X direction. The controller 109 acquires an ion beam profile by associating the position of the ion beam current measurement member 105 in the X direction with the current value in the corresponding position. The acquired ion beam profile is displayed on the display section 111.

S805: The ion beam profile as an adjustment target is read and displayed on the display section 111. This step may be executed before acquiring the ion beam profile (S804).

S806: The ion beam radiation conditions are adjusted so that the ion beam profile acquired in S804 is approximated to the target ion beam profile read in S805. Specifically, one or more parameters among the working distance, the discharge voltage and the gas flow rate of the ion source 101 are adjusted.

At this time, the acceleration voltage is not subject to adjustment. When the acceleration voltage is changed, the processing speed (milling rate) of the sample is greatly changed even if the ion beam current is the same.

S807: An ion beam profile is acquired again according to the adjusted ion beam radiation conditions. Processing in S807 is the same as processing in S804.

S808: The ion beam profile acquired in S807 is compared with the target ion beam profile read in S805, and if a desired ion beam profile is acquired, this step ends, and if a desired ion beam profile is not acquired, steps from adjustment of ion beam radiation conditions (S806) are repeated.

Above, the present invention made by the inventor is described specifically based on the embodiment, but the present invention is not limited to the described embodiment and various modifications can be made without departing from the gist thereof. For example, the present invention may function as an electronic trap by applying a positive potential to a structure that is located near the ion beam current measurement member 105 and does not operate when measuring the ion beam profile, for example a sample stage. If the ion milling apparatus includes a sample stage position adjustment mechanism capable of moving the sample stage in the Z direction, the working distance may be adjusted by the sample stage position adjustment mechanism.

The ion beam radiation conditions may be adjusted based on the ion beam profile itself, or the feature amount of the ion beam profile, for example, a peak value and a half-value width of the ion beam profile may be calculated, and the ion beam radiation conditions may be adjusted so that the feature amounts match. At this time, instead of displaying the ion beam profile itself, a feature amount as an adjustment reference may be displayed on the display section 111.

REFERENCE SIGNS LIST

100: ion milling apparatus
101: ion source
102: sample stage
103: sample stage rotation drive source
104: ion source position adjustment mechanism
105: ion beam current measurement member
106: measurement member holding section
107: drive unit
108: sample chamber
109: controller
110: power supply unit
111: display section
112: electronic trap
113: ammeter
201: first cathode
202: second cathode
203: anode
204: permanent magnet
205: acceleration electrode
206: piping
207: ion beam radiation port
301: motor
302: bevel gear
303: gear 304: rail member
310: ion beam current extraction section
311: ion beam current extraction wiring
700: electronic trap

The invention claimed is:

1. An ion milling apparatus comprising:
an ion source;
a sample stage on which a sample processed by radiating a non-convergent ion beam from the ion source is placed;
a measurement member holding section that holds a linear ion beam current measurement member extending in a first direction;
a drive unit that moves the measurement member holding section holding the ion beam current measurement member along a track extending in a second direction orthogonal to the first direction and located between the ion source and the sample stage;
an electrode that is disposed near the track; and
a controller, wherein
the controller applies a predetermined positive voltage to the electrode, moves the ion beam current measurement member within a radiation range of the ion beam by the driving unit in a state in which the ion beam is output from the ion source under a first radiation condition, and measures an ion beam current flowing through the ion beam current measurement member when the ion beam is radiated to the ion beam current measurement member.

2. The ion milling apparatus according to claim 1, wherein the controller measures an ion beam profile indicating a relationship between the ion beam current and a position of the ion beam current measurement member when the ion beam current is measured.

3. The ion milling apparatus according to claim 2, wherein the controller calculates a peak value and a half-value width of the ion beam profile.

4. The ion milling apparatus according to claim 2, further comprising:
a sample chamber; and
an ion source position adjustment mechanism that is provided in the sample chamber, wherein
the ion source is attached to the sample chamber via the ion source position adjustment mechanism,
the ion source is a penning type ion source, and
one or more of a discharge voltage of the ion source, a gas flow rate or a working distance of the ion source are adjustable based on the ion beam profile.

5. The ion milling apparatus according to claim 1, wherein the electrode is disposed closer to the sample stage from the track at a position where the ion beam current measurement member and the electrode overlap when viewed from the ion source when an ion beam center of the ion beam from the ion source and the ion beam current measurement member cross each other.

6. The ion milling apparatus according to claim 5, wherein the electrode is graphite carbon.

7. The ion milling apparatus according to claim 1, wherein the electrode is disposed closer to the ion source side from the track at a position where an ion beam is not radiated from the ion source.

8. The ion milling apparatus according to claim 7, wherein the electrode is copper or phosphorus bronze.

9. The ion milling apparatus according to claim 1, wherein the sample stage is used as the electrode.

10. The ion milling apparatus according to claim 1, wherein the ion beam current measurement member is a linear material of graphite carbon whose cross section is cylindrical and whose diameter is not more than a half-value width of the ion beam.

* * * * *